(12) United States Patent
Zhang (10) Patent No.: US 10,915,211 B2
(45) Date of Patent: Feb. 9, 2021

(54) TOUCH PANEL, METHOD FOR FABRICATING THE SAME, AND DISPLAY DEVICE

(71) Applicant: BOE Technology Group Co., Ltd., Beijing (CN)

(72) Inventor: Shuai Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/419,351

(22) Filed: May 22, 2019

(65) Prior Publication Data

US 2020/0057529 A1    Feb. 20, 2020

(30) Foreign Application Priority Data

Aug. 17, 2018    (CN) .......................... 2018 1 0943478

(51) Int. Cl.
| | | |
|---|---|---|
| *G06F 3/044* | (2006.01) | |
| *G06F 3/041* | (2006.01) | |
| *H01L 27/32* | (2006.01) | |

(52) U.S. Cl.
CPC .......... *G06F 3/0446* (2019.05); *G06F 3/0412* (2013.01); *H01L 27/323* (2013.01); *G06F 2203/04103* (2013.01); *G06F 2203/04111* (2013.01)

(58) Field of Classification Search
None
See application file for complete search history.

(56) References Cited

U.S. PATENT DOCUMENTS

| | | | | |
|---|---|---|---|---|
| 2014/0320765 | A1* | 10/2014 | Jiang .................. | G06F 3/044 349/12 |
| 2016/0066409 | A1* | 3/2016 | Kwon ................. | H01L 27/124 174/254 |
| 2016/0306479 | A1* | 10/2016 | Zhu ..................... | G06F 3/044 |
| 2019/0363137 | A1* | 11/2019 | Feng .................... | H01L 27/323 |

* cited by examiner

*Primary Examiner* — Matthew Yeung
(74) *Attorney, Agent, or Firm* — Arent Fox LLP; Michael Fainberg (57) ABSTRACT

The disclosure discloses a touch panel, a method for fabricating the same, and a touch device; where the touch panel includes: a buffer layer with protrusions, overlapping components, a first insulation layer, and touch electrodes, which are arranged on a substrate in that order, where the touch electrodes overlap with the overlapping components through via-holes extending through the first insulation layer, and at least portions, of the overlapping components, overlapping with the touch electrodes are on the protrusions.

18 Claims, 5 Drawing Sheets

TOUCH PANEL, METHOD FOR FABRICATING THE SAME, AND DISPLAY DEVICE

CROSS-REFERENCE TO RELATED APPLICATION

This Application claims priority to Chinese Patent Application No. 201810943478.6, filed on Aug. 17, 2018, the content of which is incorporated by reference in the entirety.

FIELD

This disclosure relates to the field of display technologies, and particularly to a touch panel, a method for fabricating the same, and a display device.

DESCRIPTION OF THE RELATED ART

In the related art, more and more organic Light-Emitting Diode (OLED) touch display products are emerging, and in order to obtain a thinner overall structure, such OLED products tend to be fabricated in such a way that touch electrodes are formed directly on back panels of the OLED products.

SUMMARY

Embodiments of the disclosure provide a touch panel, a method for fabricating the same, and a display device.

In an aspect, the embodiments of the disclosure provide a touch panel including: a buffer layer with protrusions, overlapping components, a first insulation layer, and touch electrodes, which are arranged on a substrate in that order; wherein the touch electrodes overlap with the overlapping components through via-holes extending through the first insulation layer; and at least portions, of the overlapping components, overlapping with the touch electrodes are on the protrusions.

In some embodiments, the buffer layer includes an area with a first thickness and an area with a second thickness, the first thickness is greater than the second thickness, and the protrusions are in the area with the first thickness.

In some embodiments, the overlapping components correspond to the protrusions in a one-to-one manner.

In some embodiments, a cross section of each of the via-holes perpendicular to the substrate is in a stepped shape or a rectangular shape.

In some embodiments, the first insulation layer is an over coating glue layer or a silicon nitride layer.

In some embodiments, the touch panel is an organic light-emitting diode (OLED) panel, and the substrate is a substrate formed by performing a vapor-deposition process and an encapsulation process on an OLED back panel.

In some embodiments, materials of the overlapping components and the touch electrodes are metal.

In another aspect, the embodiments of the disclosure further provide a method for fabricating a touch panel, the method including: forming a buffer layer, overlapping components, a first insulation layer with via-holes, and touch electrodes overlapping with the overlapping components through the via-holes, on a substrate in that order; and forming the buffer layer on the substrate includes: forming the buffer layer with protrusions at least in areas, of the overlapping components, overlapping with the touch electrodes.

In some embodiments, forming the buffer layer with the protrusions at least in the areas, of the overlapping components, overlapping with the touch electrodes includes: arranging an insulation material on the substrate to form an insulation layer; and patterning the insulation layer to form the protrusions corresponding to the overlapping components in a one-to-one manner.

In some embodiments, patterning the insulation layer to form the protrusions corresponding to the overlapping components in the one-to-one manner includes: processing the insulation layer in a half tone mask process to form an area with a first thickness and an area with a second thickness at the insulation layer; and forming the protrusions corresponding to the overlapping components in the one-to-one manner in the area with the first thickness; wherein the first thickness is greater than the second thickness.

In some embodiments, arranging the insulation material on the substrate to form the insulation layer includes: depositing silicon nitride on the substrate to form the insulation layer; processing the insulation layer in the half tone mask process to form the area with the first thickness and the area with the second thickness at the insulation layer, and forming the protrusions in the area with the first thickness includes: coating photo-resist on the insulation layer; processing the photo-resist in the half tone mask process to form a pattern of the photo-resist, wherein a thickness of the photo-resist in an area to be formed with the first thickness is greater than a thickness thereof in an area to be formed with the second thickness; etching the insulation layer to form the protrusions in the area with the first thickness; and removing a remaining photo-resist in a photo-resist stripping process.

In some embodiments, arranging the insulation material on the substrate to form the insulation layer includes: coating over coating glue on the substrate to form an over coating glue layer; processing the insulation layer in the half tone mask process to form the area with the first thickness and the area with the second thickness at the insulation layer, and forming the protrusions in the area with the first thickness includes: exposing and developing the over coating glue layer in the half tone mask process to form the insulation layer including the area with the first thickness and the area with the second thickness; and forming the protrusions in the area with the first thickness.

In some embodiments, forming the first insulation layer with the via-holes includes: depositing an insulation material to form an insulation layer; coating photo-resist on the insulation layer; exposing and developing the photo-resist; etching the insulation layer; and ashing the photo-resist and etching the insulation layer at least once to form the via-holes with a cross section perpendicular to the substrate in a stepped shape.

In still another aspect, the embodiments of the disclosure further provide a touch device, including a touch panel, wherein the touch panel includes: a buffer layer with protrusions, overlapping components, a first insulation layer, and touch electrodes, which are arranged on a substrate in that order; wherein the touch electrodes overlap with the overlapping components through via-holes extending through the first insulation layer; and at least portions, of the overlapping components, overlapping with the touch electrodes are on the protrusions.

In some embodiments, the buffer layer includes an area with a first thickness and an area with a second thickness, the first thickness is greater than the second thickness, and the protrusions are in the area with the first thickness.

In some embodiments, the overlapping components correspond to the protrusions in a one-to-one manner.

In some embodiments, a cross section of each of the via-holes perpendicular to the substrate is in a stepped shape or a rectangular shape.

In some embodiments, the first insulation layer is an over coating glue layer or a silicon nitride layer.

In some embodiments, the touch panel is an organic light-emitting diode (OLED) panel, and the substrate is a substrate formed by performing a vapor-deposition process and an encapsulation process on an OLED back panel.

In some embodiments, materials of the overlapping components and the touch electrodes are metal.

BRIEF DESCRIPTION OF THE DRAWINGS

In order to make the technical solutions according to the embodiments of the disclosure more apparent, the drawings to which reference is to be made in the description of the embodiments will be introduced below in brief, and apparently the drawings to be described below illustrate only some embodiments of the disclosure, and those ordinarily skilled in the art can derive other drawings from these drawings without any inventive effort.

DETAILED DESCRIPTION OF THE EMBODIMENTS

In the related art, when a touch electrode formed on the back panel includes a metal bridge structure, two metal layers need to be arranged, and if the first metal layer is a bridge, and the second metal layer is across the bridge, then a dielectric layer with via-holes will be formed between the first metal layer and the second metal layer, and the second metal layer will overlap with the first metal layer through the via-holes. However in the related art, the dielectric layer with the via-holes is formed in a patterning process using low-temperature photo-resist (PR) and a slope of each via-hole formed at the dielectric layer in the patterning process is so large due to the restriction of the photo-resist that a wire may be easily broken at an overlapping point between the second metal layer and the first metal layer through the via-holes, thus degrading the good yield of the touch display product.

Figure 1:
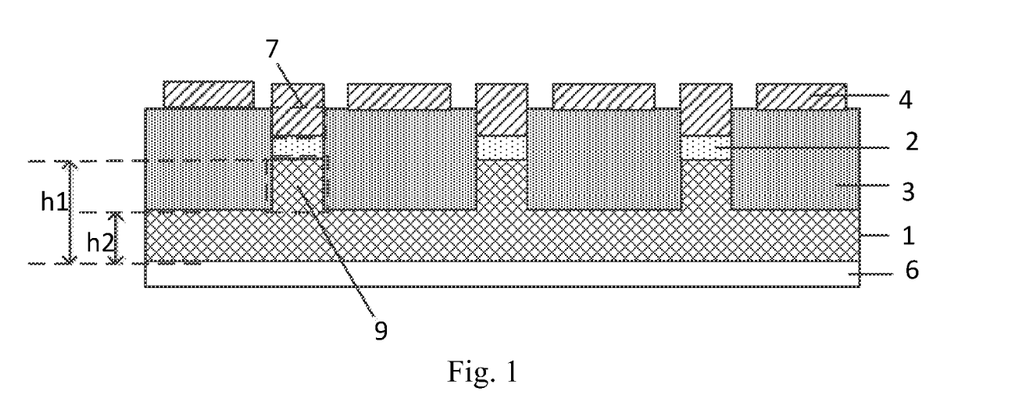
FIG. 1 is a schematic structural diagram of a touch panel according to the embodiments of the disclosure.

As illustrated in FIG. 1, the embodiments of the disclosure provide a touch panel, including: a buffer layer 1 with protrusions 9, overlapping components 2, a first insulation layer 3, and touch electrodes 4, which are arranged on a substrate 6 in that order; where the touch electrodes overlap with the overlapping components 2 through via-holes 7 extending through the first insulation layer 3; and at least portions, of the overlapping components 2, overlapping with the touch electrodes 4 are on the protrusions 9.

In the touch panel according to the embodiments of the disclosure, since the buffer layer is provided with the protrusions, a thickness of a subsequently formed first insulation layer on the protrusions is less than thicknesses of the other portions of the first insulation layer, and since at least the portions of the overlapping components, which overlap with the touch electrodes are arranged on the protrusions, depths of the via-holes extending through the first insulation layer are less than a largest thickness of the first insulation layer, that is, the buffer layer with the protrusions is formed so that the depths of the via-holes can be reduced relative to the largest thickness of the first insulation layer to thereby avoid a large slope from occurring in a process of forming the via-holes on the first insulation layer, so as to avoid a wire from being broken at an overlapping point between the touch electrodes and the overlapping components through the via-holes, thus improving the good yield of the product.

In some embodiments, in the touch panel as illustrated in FIG. 1 according to the embodiments of the disclosure, the buffer layer 1 with the protrusions 9 includes an area with a first thickness h1 and an area with a second thickness h2, where the first thickness is greater than the second thickness, and the protrusions 9 are in the area with the first thickness h1.

In the touch panel according to the embodiments of the disclosure, since the buffer layer includes the area with the first thickness and the area with the second thickness, the protrusions are in the area with the first thickness, and the first thickness is greater than the second thickness, a thickness of the first insulation layer above the area, with the first thickness, of the buffer layer is less than a thickness of the first insulation layer above the area, with the second thickness, of the buffer layer, so that the thickness of the first insulation layer above the area, with the second thickness, of the buffer layer can be guaranteed while the buffer layer with the protrusions is formed so that the depths of the via-holes are reduced relative to the largest thickness of the first insulation layer, and thus the buffer layer can be avoided from being damaged in a fabrication process of the touch panel as opposed to simply reducing an overall thickness of the first insulation layer. Stated otherwise, in the touch panel according to the embodiments of the disclosure, the depths of the via-holes extending through the first insulation layer can be reduced as compared with the related art without changing the largest thickness of the first insulation layer, to thereby avoid a wire from being broken at an overlapping point between the touch electrodes and the overlapping components while protecting the buffer layer.

It shall be noted that, the touch panel according to the embodiments of the disclosure can be a touch display panel such as an OLED panel, and if the touch panel is an OLED panel, then the substrate of the touch panel according to the embodiments of the disclosure can be a substrate formed by performing a vapor-deposition process and an encapsulation process on an OLED back panel, and OLED cathodes will be located below an encapsulation layer accordingly. And in the touch panel according to the embodiments of the disclosure, since the thickness of the first insulation layer above the area, with the second thickness, of the buffer layer can be guaranteed while the buffer layer with the protrusions is formed so that the depths of the via-holes are reduced relative to the largest thickness of the first insulation layer, thicknesses between the touch electrodes and the cathodes can be guaranteed to thereby avoid the cathodes from interfering with a touch. Moreover, in a practical implementation, the protrusions can alternatively be formed on the substrate to form the buffer layer, and for a touch display panel, since respective layers for performing a touch function are arranged above the encapsulation layer, the buffer layer 1 with the protrusions 9 in the touch panel as illustrated in FIG. 1 includes an area with a first thickness h1 and an area with a second thickness h2, that is, the buffer layer 2 covers the substrate 6, so that the encapsulation layer can be avoided from being damaged in the fabrication process of the touch panel.

In the touch panel according to the embodiments of the disclosure, a wire can be avoided from being broken at an overlapping point as long as a portion, of each overlapping component, which overlaps with the touch electrodes is on the protrusions, and of course, the protrusions and the overlapping components can be arranged flexibly as needed in reality dependent upon the difficulty of a process.

In some embodiments, in the touch panel as illustrated in FIG. 1 according to the embodiments of the disclosure, the overlapping components 2 correspond to the protrusions 9 in a one-to-one manner, that is, the overlapping components 2 are located on the protrusions 9 entirely.

Figure 2:
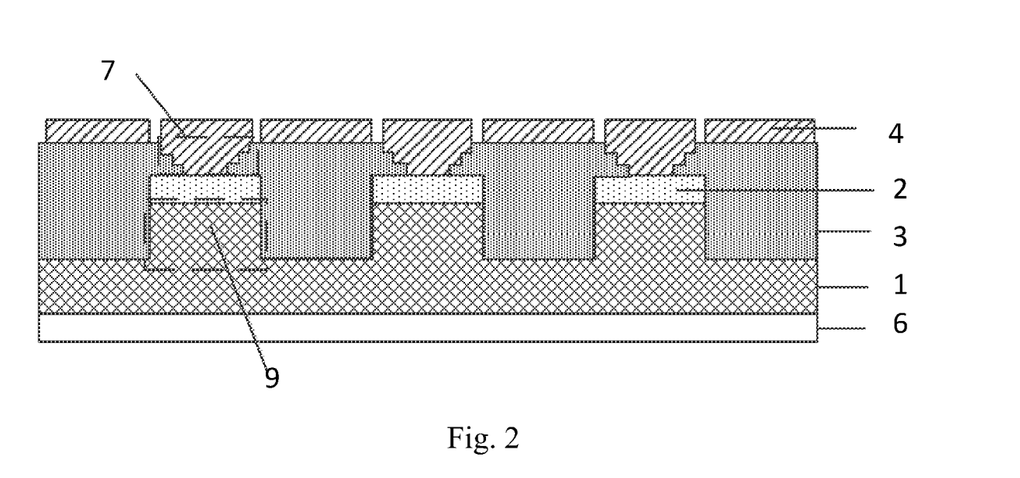
FIG. 2 is another schematic structural diagram of a touch panel according to the embodiments of the disclosure.

In some embodiments, as illustrated in FIG. 2, a cross section of a via-hole 7 perpendicular to the substrate 6 is in a stepped shape, so that a wire can be further avoided from being broken at an overlapping point between the touch electrodes and the overlapping components.

In some embodiments, the buffer layer is an over coating (OC) glue layer, and the first insulation layer can also be an OC glue layer. And when a material of the first insulation layer is the OC glue, the via-holes extending through the first insulation layer can be formed without arranging any photo-resist, thereby a large slope can be avoided from occurring when the via-holes are formed at the first insulation layer due to the arrangement of the photo-resist, so as to further avoid a wire from being broken at an overlapping point.

Figure 3:
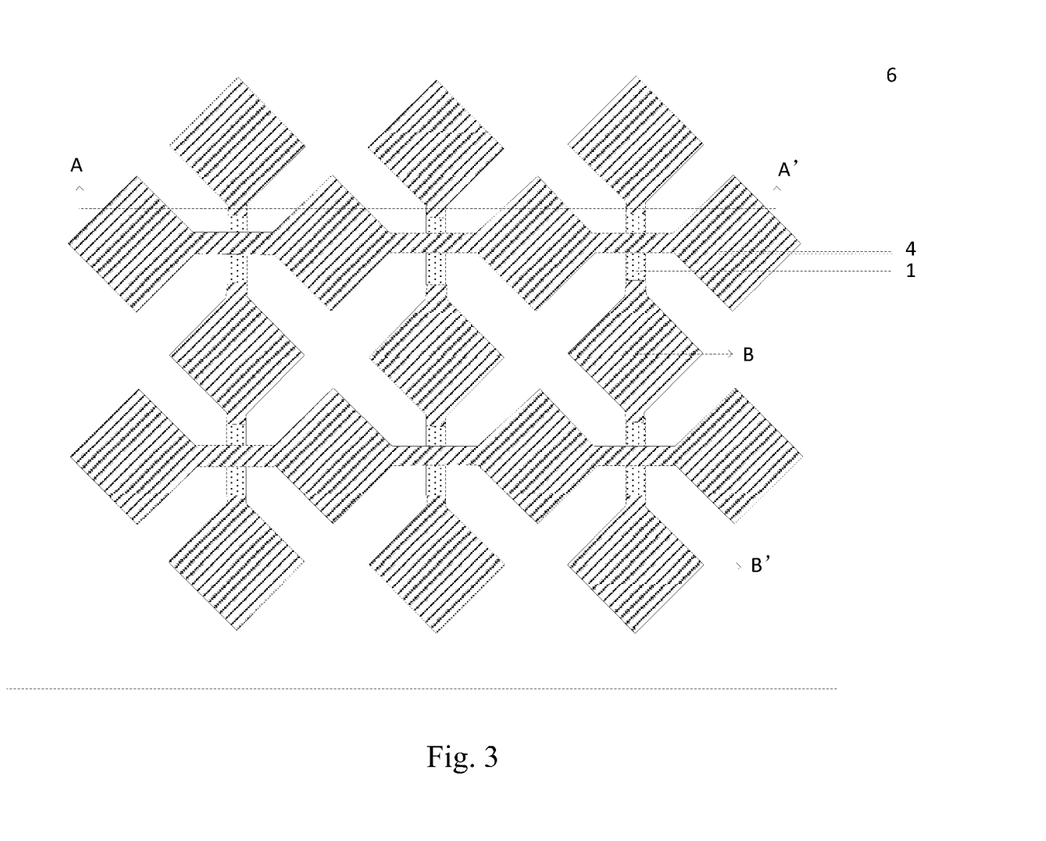
FIG. 3 is a further schematic structural diagram of a touch panel according to the embodiments of the disclosure.
Figure 4:
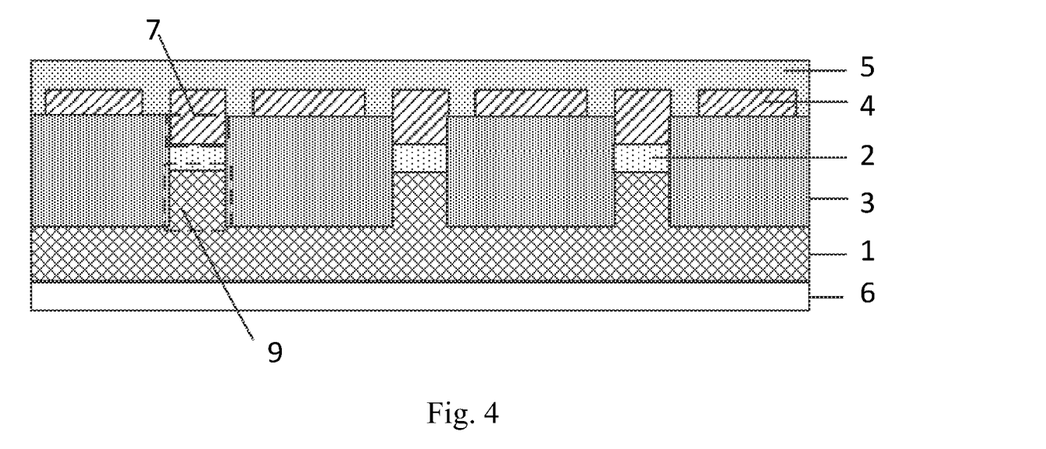
FIG. 4 is a sectional view along AA' in FIG. 3 according to the embodiments of the disclosure.
Figure 5:
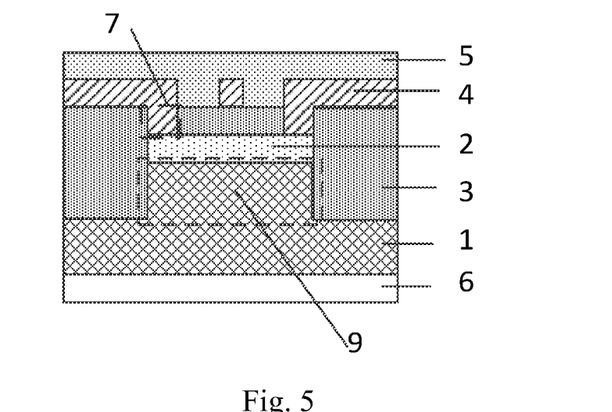
FIG. 5 is a sectional view along BB' in FIG. 3 according to the embodiments of the disclosure.

In some embodiments, the touch panel according to the embodiments of the disclosure further includes a second insulation layer. As illustrated in FIG. 3 to FIG. 5, where FIG. 4 is a sectional view along AA' in FIG. 3, and FIG. 5 is a sectional view along BB' in FIG. 3, the touch panel includes: the buffer layer 1, the overlapping components 2, the first insulation layer 3 with via-holes 7, the touch electrodes 4, and a second insulation layer 5, which are arranged on the substrate 6 in that order; where the buffer layer 1 includes an area with a first thickness h1 and an area with a second thickness h2, the protrusions 9 are in the area with the first thickness, the overlapping components 2 correspond to the protrusions 9 in a one-to-one manner, and the entire overlapping components 2 are on the protrusions 9.

In some embodiments, in the touch panel according to the embodiments of the disclosure, materials of the overlapping components and the touch electrodes can be metal.

Based upon the same inventive concept, the embodiments of the disclosure further provide a method for fabricating a touch panel, where the method includes forming a buffer layer, overlapping components, a first insulation layer with via-holes, and touch electrodes overlapping with the overlapping components through the via-holes, on a substrate in that order; and forming the buffer layer on the substrate includes: forming the buffer layer with protrusions at least in areas, of the overlapping components, overlapping with the touch electrodes.

In the method for fabricating the touch panel according to the embodiments of the disclosure, since the buffer layer is provided with the protrusions, the thickness of the subsequently formed first insulation layer on the protrusions is less than the thicknesses of the other portions of the first insulation layer, and since the protrusions are formed at least in the areas, of the overlapping components, which overlap with the touch electrodes, the depths of the via-holes to be formed in a process of subsequently forming the first insulation layer shall be less than the largest thickness of the first insulation layer, that is, the buffer layer with the protrusions is formed so that the depths of the via-holes can be reduced relative to the largest thickness of the first insulation layer to thereby avoid a large slope from occurring in a process of forming the via-holes on the first insulation layer, so as to avoid a wire from being broken at an overlapping point between the touch electrodes and the overlapping components through the via-holes, thus improving the good yield of the product.

In some embodiments, forming the buffer layer with the protrusions at least in the areas, of the overlapping components, overlapping with the touch electrodes includes: arranging an insulation material on the substrate to form an insulation layer; and patterning the insulation layer to form the protrusions corresponding to the overlapping components in a one-to-one manner. In this way, the entire overlapping components are subsequently arranged on the protrusions.

In some embodiments, patterning the insulation layer to form the protrusions corresponding to the overlapping components in a one-to-one manner includes: processing the insulation layer in a half tone mask process to form an area with a first thickness and an area with a second thickness at the insulation layer, and forming the protrusions corresponding to the overlapping components in a one-to-one manner in the area with the first thickness; where the first thickness is greater than the second thickness.

Figure 6:
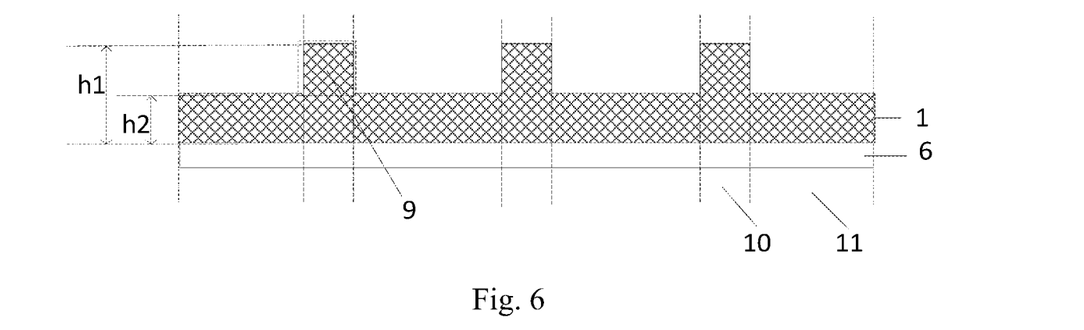
FIG. 6 is a schematic structural diagram of a buffer layer formed in a method for fabricating a touch panel according to the embodiments of the disclosure.

There are different transmittances of the half tone mask process to photo-resist of a mask at different etching depths, so the buffer layer including the areas with the different thicknesses can be subsequently formed. FIG. 6 illustrates a schematic structural diagram of the buffer layer, formed in the half tone mask process, which includes the areas with the different thicknesses, where the buffer layer 1 formed on the substrate 6 includes the area 10 with the first thickness h1 and the area 11 with the second thickness h2, where the first thickness h1 is greater than the second thickness h2, so that the protrusions 9 are formed in the area 10 with the first thickness h1.

In some embodiments, the insulation material is silicon nitride ($SiN_x$); and arranging the insulation material on the substrate to form the insulation layer includes: depositing silicon nitride on the substrate to form the insulation layer.

Accordingly, processing the insulation layer in the half tone mask process to form the area with the first thickness and the area with the second thickness at the insulation layer, and forming the protrusions in the area with the first thickness includes: coating photo-resist on the insulation layer; processing the photo-resist in the half tone mask process to form a pattern of the photo-resist, where a thickness of the photo-resist in an area to be formed with the first thickness is greater than a thickness thereof in an area to be formed with the second thickness; etching the insulation layer to form the protrusions in the area with the first thickness; and removing the remaining photo-resist in a photo-resist stripping process.

There are different transmittances of the half tone mask process to the photo-resist of a mask at different etching depths, so that the pattern of the photo-resist with the different thicknesses can be formed, and furthermore the buffer including the area with the first thickness, and the area with the second thickness can be formed.

Of course, the buffer layer can alternatively be made of another material, and the process of forming the buffer layer can be modified according to the selected material thereof.

In some embodiments, arranging the insulation material on the substrate to form the insulation layer includes: coating over coating glue on the substrate to form an over coating glue layer.

Processing the insulation layer in the half tone mask process to form the area with the first thickness and the area with the second thickness at the insulation layer, and forming the protrusions in the area with the first thickness includes: exposing and developing the over coating glue layer in the half tone mask process to form the insulation layer including the area with the first thickness and the area with the second thickness, and forming the protrusions in the area with the first thickness.

It shall be noted that, when the material of the buffer layer is OC glue, the pattern of the buffer layer with the different thicknesses can be formed by exposing and developing the OC glue directly without coating any photo-resist on the OC glue, and subsequently stripping the photo-resist, to thereby simplify the flow of fabricating the touch display panel.

It shall be noted that, in the method above for fabricating the touch panel according to the embodiments of the disclosure, the insulation layer can be patterned in the half tone mask process to form the buffer layer with the protrusions. Of course, the protrusions can alternatively be formed on a planar insulation layer so that the thicknesses of the via-holes can also be reduced relative to the largest thickness of the first insulation layer, so as to avoid a wire from being subsequently broken at an overlapping point between the touch electrodes and the overlapping components.

Figure 7:
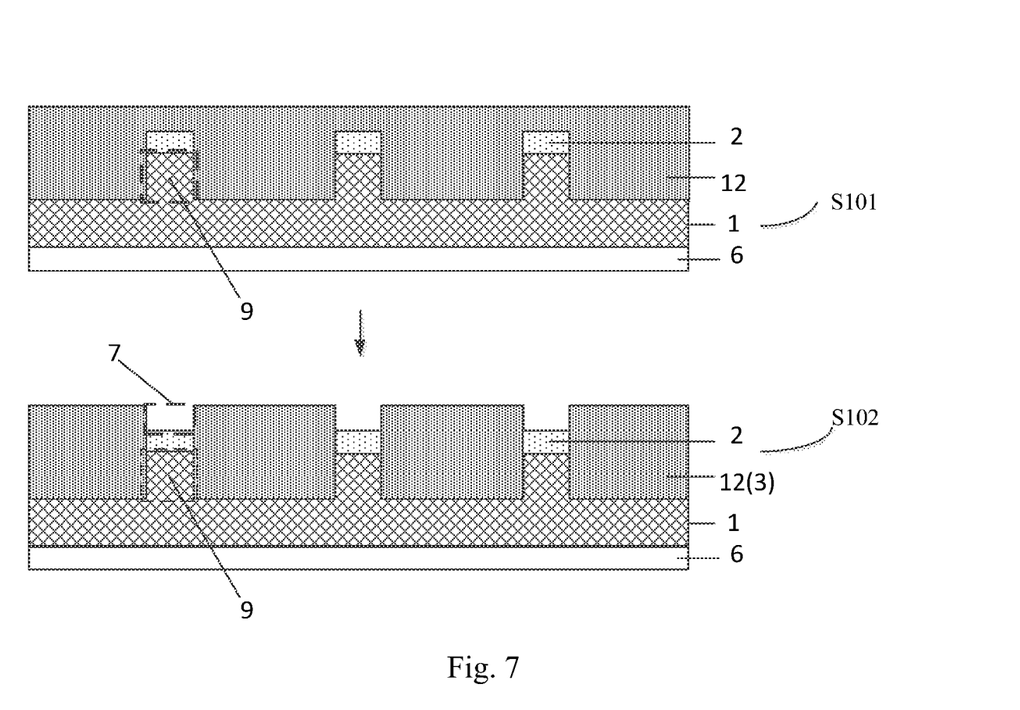
FIG. 7 is a schematic flow chart of a method for fabricating a touch panel according to the embodiments of the disclosure.

In some embodiments, taking the buffer layer as illustrated in FIG. 6 as an example, the overlapping components are located on the protrusions, and as illustrated in FIG. 7, forming the first insulation layer with a plurality of via-holes includes following operations.

The operation S101 is to coat over coating glue on the buffer layer 1 and the overlapping components 2 to form an insulation layer 12.

The operation S102 is to expose and develop the insulation layer 12 to form the via-holes 7 extending through the insulation layer 12 to expose the overlapping components 2.

It shall be noted that, when the material of the first insulation layer is OC glue, then the first insulation layer with the via-holes can be formed without arranging any photo-resist, to thereby avoid a large slope from occurring when the via-holes are formed at the first insulation layer, due to the arrangement of the photo-resist so as to further avoid a wire from being subsequently broken at an overlapping point between the touch electrodes and the overlapping components.

The process above of forming the pattern of the first insulation layer with the plurality of via-holes has been described by way of an example in which the material of the first insulation layer is OC glue, but of course, the first insulation layer can alternatively be made of another material, and a particular process thereof can be modified as appropriate. In addition, in FIG. 7, a cross section of a via-hole 7 perpendicular to the substrate 1 is a rectangle, but of course, the cross section of the via-hole perpendicular to the substrate can alternatively be another shape, which will not be limited herein.

In some embodiments, forming the first insulation layer with the plurality of via-holes includes: depositing an insulation material to form an insulation layer; coating photo-resist on the insulation layer; exposing and developing the photo-resist; etching the insulation layer; and ashing the photo-resist and etching the insulation layer at least once respectively to form the via-holes with a cross section perpendicular to the substrate in a stepped shape.

Figure 8:
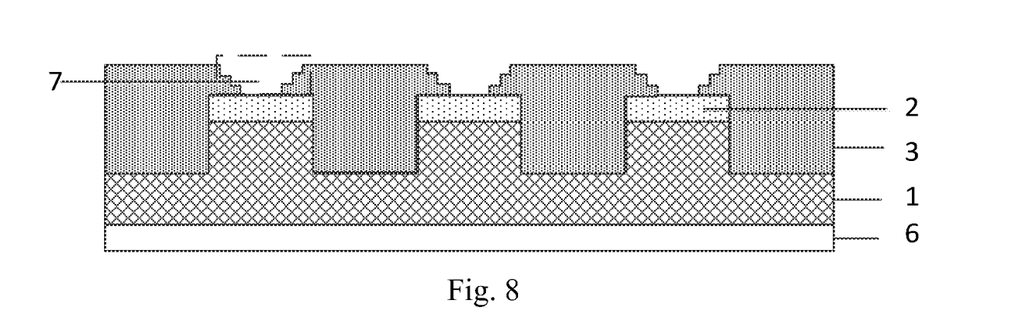
FIG. 8 is a schematic structural diagram of a via-hole with a stepped sectional view formed in a method for fabricating a touch panel according to the embodiments of the disclosure.

It shall be noted that, after the insulation layer is etched, the photo-resist can be further ashed and the insulation layer can be further etched once respectively to form the via-holes with a cross section perpendicular to the substrate in a stepped shape, and the number of steps in the formed stepped shape can vary as the number of times that the photo-resist is ashed and the insulation layer is etched are varying. For example, after the photo-resist is ashed and the insulation layer is etched twice respectively, an edge of a cross section of a via-hole 7 perpendicular to the substrate is shaped like a ladder including two steps as illustrated in FIG. 8. In the process above for forming the first insulation layer, the insulation material can be silicon nitride, for example. It shall be noted that, even if the material of the first insulation layer is silicon nitride, and the pattern of the first insulation layer with the via-holes will be formed using photo-resist, but since the depths of the formed via-holes of the first insulation layer is less than the largest thickness of the first insulation layer, and the edges of the formed via-holes and the first insulation layer are shaped like a ladder, a wire can be avoided from being broken at an overlapping point between the touch electrodes and the overlapping components.

In some embodiments, the method further includes: forming a second insulation layer covering the touch electrodes; where a material of the second insulation layer can be $SiN_x$, for example.

It shall be noted that, in the method for fabricating the touch panel according to the embodiments of the disclosure, the substrate can be a substrate formed by performing a vapor-deposition process and an encapsulation process on an OLED back panel, and subsequently the touch electrodes can be formed on the substrate in a Flexible Metal-Layer On Cell (FMLOC) process.

Figure 9:
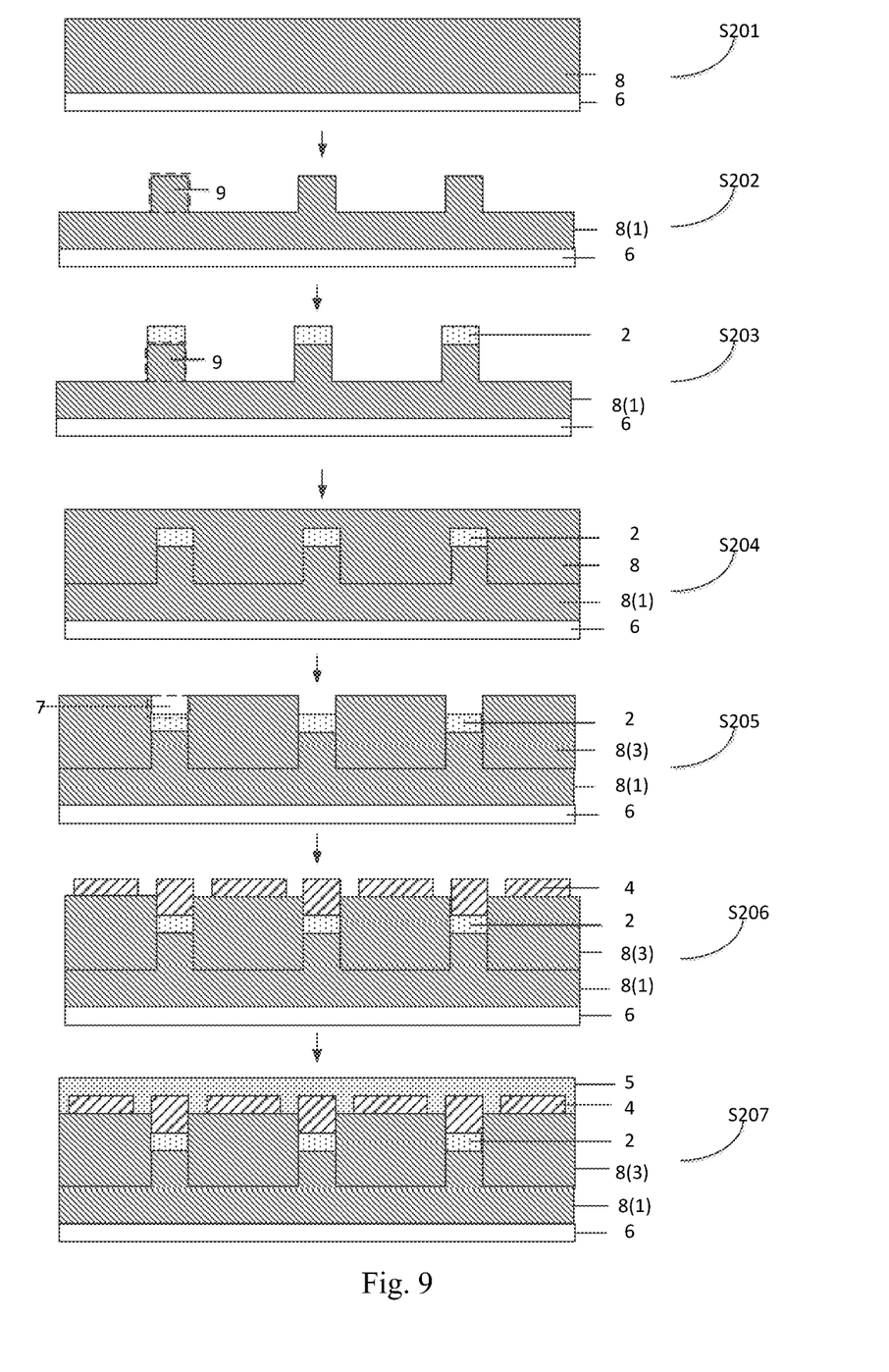
FIG. 9 is another schematic flow chart of a method for fabricating a touch panel according to the embodiments of the disclosure.

Next, the method for fabricating the touch panel according to the embodiments of the disclosure will be described by way of an example in which the materials of the buffer layer and the first insulation layer are OC glue, and as illustrated in FIG. 9, the method for fabricating the touch panel includes following operations.

The operation S201 is to coat over coating glue on the substrate 6 to form an over coating glue layer 8.

The operation S202 is to expose and develop the over coating glue layer 8 in a half tone mask process to form the buffer layer 1 with the protrusions 9.

The operation S203 is to form a pattern of the overlapping components 2 on the protrusions 9.

The operation S204 is to coat over coating glue on the buffer layer 1 and the overlapping components 2 to form another over coating glue layer 8.

The operation S205 is to expose and develop the other over coating glue layer 8 to form the via-holes 7 extending through the other over coating glue layer 8.

The operation S206 is to form the touch electrodes 4 overlapping with the overlapping components 2 through the via-holes 7.

The operation S207 is to form the second insulation layer 5.

Based upon a same inventive concept, the embodiments of the disclosure provide a touch device including the touch panel according to the embodiments of the disclosure.

The touch device according to the embodiments of the disclosure can be a mobile phone, a tablet computer, etc., for example.

In summary, in the touch panel, the method for fabricating the same, and the touch display according to the embodiments of the disclosure, since the buffer layer is provided with the protrusions, the thickness of the subsequently formed first insulation layer on the protrusions is less than the thicknesses of the other portions of the first insulation layer, and since the protrusions are formed at least in the areas, of the overlapping components, which overlap with the touch electrodes, the depths of the via-holes to be formed in a process of subsequently forming the first insulation layer shall be less than the largest thickness of the first insulation layer, that is, the buffer layer with the protrusions is formed so that the depths of the via-holes can be reduced relative to the largest thickness of the first insulation layer to thereby avoid a large slope from occurring in a process of forming the via-holes on the first insulation layer, so as to avoid a wire from being broken at an overlapping point between the touch electrodes and the overlapping components through the via-holes, thus improving the good yield of the product.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A touch panel, comprising: a buffer layer with protrusions, overlapping components, a first insulation layer, and touch electrodes, which are arranged on a substrate in that order;
   wherein the touch electrodes overlap with the overlapping components through via-holes extending through the first insulation layer; and
   at least portions, of the overlapping components, overlapping with the touch electrodes are on the protrusions;
   wherein the buffer layer comprises an area with a first thickness and an area with a second thickness, the first thickness is greater than the second thickness, and the protrusions are in the area with the first thickness;
   wherein the protrusions are configured that a thickness of a first initial insulation layer on the protrusions is less than a thickness of other portions of the first initial insulation layer;
   the first insulation layer is formed after forming the via-holes extending through the first initial insulation layer on the protrusions;
   the via-holes are configured to expose a side, far away from the substrate, of the protrusions, and the overlapping components are arranged in the via-holes and get into contact with the protrusions; and
   both thicknesses of the overlapping components and thicknesses of the touch electrodes are less than a thickness of the first insulation layer.

2. The touch panel according to claim 1, wherein the overlapping components correspond to the protrusions in a one-to-one manner.

3. The touch panel according to claim 1, wherein a cross section of each of the via-holes perpendicular to the substrate is in a stepped shape or a rectangular shape.

4. The touch panel according to claim 1, wherein the first insulation layer is an over coating glue layer or a silicon nitride layer.

5. The touch panel according to claim 1, wherein the touch panel is an organic light-emitting diode (OLED) panel, and the substrate is a substrate formed by performing a vapor-deposition process and an encapsulation process on an OLED back panel.

6. The touch panel according to claim 1, wherein materials of the overlapping components and the touch electrodes are metal.

7. A method for fabricating the touch panel according to claim 1, the method comprising:
   forming a buffer layer, overlapping components, a first insulation layer with via-holes, and touch electrodes overlapping with the overlapping components through the via-holes, on a substrate in that order; and
   forming the buffer layer on the substrate comprises:
   forming the buffer layer with protrusions at least in areas, of the overlapping components, overlapping with the touch electrodes.

8. The method according to claim 7, wherein forming the buffer layer with the protrusions at least in the areas, of the overlapping components, overlapping with the touch electrodes comprises:
   arranging an insulation material on the substrate to form an insulation layer; and
   patterning the insulation layer to form the protrusions corresponding to the overlapping components in a one-to-one manner.

9. The method according to claim 8, wherein patterning the insulation layer to form the protrusions corresponding to the overlapping components in the one-to-one manner comprises:
   processing the insulation layer in a half tone mask process to form an area with a first thickness and an area with a second thickness at the insulation layer; and
   forming the protrusions corresponding to the overlapping components in the one-to-one manner in the area with the first thickness; wherein the first thickness is greater than the second thickness.

10. The method according to claim 9, wherein arranging the insulation material on the substrate to form the insulation layer comprises:
   depositing silicon nitride on the substrate to form the insulation layer;
   processing the insulation layer in the half tone mask process to form the area with the first thickness and the area with the second thickness at the insulation layer, and forming the protrusions in the area with the first thickness comprises:
   coating photo-resist on the insulation layer;
   processing the photo-resist in the half tone mask process to form a pattern of the photo-resist, wherein a thickness of the photo-resist in an area to be formed with the first thickness is greater than a thickness thereof in an area to be formed with the second thickness;
   etching the insulation layer to form the protrusions in the area with the first thickness; and
   removing a remaining photo-resist in a photo-resist stripping process.

11. The method according to claim 9, wherein arranging the insulation material on the substrate to form the insulation layer comprises:

coating over coating glue on the substrate to form an over coating glue layer;

processing the insulation layer in the half tone mask process to form the area with the first thickness and the area with the second thickness at the insulation layer, and forming the protrusions in the area with the first thickness comprises:

exposing and developing the over coating glue layer in the half tone mask process to form the insulation layer comprising the area with the first thickness and the area with the second thickness; and forming the protrusions in the area with the first thickness.

12. The method according to claim 7, wherein forming the first insulation layer with the via-holes comprises:

depositing an insulation material to form an insulation layer;

coating photo-resist on the insulation layer;

exposing and developing the photo-resist;

etching the insulation layer; and ashing the photo-resist and etching the insulation layer at least once to form the via-holes with a cross section perpendicular to the substrate in a stepped shape.

13. A touch device, comprising a touch panel, wherein the touch panel comprises: a buffer layer with protrusions, overlapping components, a first insulation layer, and touch electrodes, which are arranged on a substrate in that order;

wherein the touch electrodes overlap with the overlapping components through via-holes extending through the first insulation layer; and at least portions, of the overlapping components, overlapping with the touch electrodes are on the protrusions;

wherein the buffer layer comprises an area with a first thickness and an area with a second thickness, the first thickness is greater than the second thickness, and the protrusions are in the area with the first thickness;

wherein the protrusions are configured that a thickness of a first initial insulation layer on the protrusions is less than a thickness of other portions of the first initial insulation layer;

the first insulation layer is formed after forming the via-holes extending through the first initial insulation layer on the protrusions;

the via-holes are configured to expose a side, far away from the substrate, of the protrusions, and the overlapping components are arranged in the via-holes and get into contact with the protrusions; and both thicknesses of the overlapping components and thicknesses of the touch electrodes are less than a thickness of the first insulation layer.

14. The touch device according to claim 13, wherein the overlapping components correspond to the protrusions in a one-to-one manner.

15. The touch device according to claim 13, wherein a cross section of each of the via-holes perpendicular to the substrate is in a stepped shape or a rectangular shape.

16. The touch device according to claim 13, wherein the first insulation layer is an over coating glue layer or a silicon nitride layer.

17. The touch device according to claim 13, wherein the touch panel is an organic light-emitting diode (OLED) panel, and the substrate is a substrate formed by performing a vapor-deposition process and an encapsulation process on an OLED back panel.

18. The touch device according to claim 13, wherein materials of the overlapping components and the touch electrodes are metal.

* * * * *